United States Patent
Wondrak et al.

(10) Patent No.: US 6,429,459 B1
(45) Date of Patent: Aug. 6, 2002

(54) SEMICONDUCTOR COMPONENT WITH FOREIGN ATOMS INTRODUCED BY ION IMPLANTATION AND PROCESS FOR PRODUCING THE SAME

(75) Inventors: Wolfgang Wondrak, Frankfurt; Vera Lauer, Griesheim; Nando Kaminski, Moerfelden-Walldorf; Raban Held, Moembris; Gerhard Pensl, Herzogenaurach, all of (DE); Scott T. Sheppard, Durham, NC (US)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/051,716
(22) PCT Filed: Jul. 23, 1997
(86) PCT No.: PCT/EP97/03981
§ 371 (c)(1),
(2), (4) Date: Apr. 17, 1998
(87) PCT Pub. No.: WO98/08247
PCT Pub. Date: Feb. 26, 1998

(30) Foreign Application Priority Data

Aug. 17, 1996 (DE) .......................................... 196 33 184

(51) Int. Cl.[7] .......................................... H01L 31/0312
(52) U.S. Cl. .......................................... 257/77; 438/530
(58) Field of Search .......................... 257/77; 438/514, 438/526, 530, 931

(56) References Cited

U.S. PATENT DOCUMENTS

| | | |
|---|---|---|
| 5,087,576 A | 2/1992 | Edmond et al. |
| 5,298,446 A | 3/1994 | Onishi et al. |
| 5,322,802 A | 6/1994 | Baliga et al. |
| 5,334,556 A | 8/1994 | Guldi |
| 6,022,458 A * | 2/2000 | Ichikawa ............... 204/192.23 |

FOREIGN PATENT DOCUMENTS

| | | |
|---|---|---|
| EP | 0 506 416 A2 | 3/2002 |
| JP | 08-107067 | 4/1996 |

OTHER PUBLICATIONS

M.V. Rao et al.: "Al and N ion implantations in 6H–SiC". Inst. Phys. Conference Ser. No. 142, Chapter 3; pp. 521–524. XP 002047800.

M.V. Rao et al.: "P–N junction formation in 6H–SiC by acceptor implantation into n–type substrate". Nuclear Instruments and Methods in Physics Research B106 (1995) pp. 333–338. XP 002047801.

W. Skorupa et al.: "Ion beam processing of single crystalline silicon carbide". Nuclear Instruments and Methods in Physics Research B120 (1996) pp. 114–120. XP 002047802.

R. Lossy et al.: "Doping of 3C–SiC by Implantation of Nitrogen at High Temperature". Journal of Electronic Materials, vol. 26, No. 3, 1997, pp. 123–137.

J.R. Flemish et al.: "Ion–Implantation and Activation of Aluminum in 6H–SiC", J. Electrochem. Soc., vol. 142, No. 9, Sep. 1995, pp. L144–L146.

* cited by examiner

*Primary Examiner*—Sara Crane
(74) *Attorney, Agent, or Firm*—Venable; George H. Spencer; Catherine M. Voorhees

(57) ABSTRACT

A semiconductor component having impurity atoms introduced by implantation which are subsequently electrically activated by way of an annealing process. Immediately after the annealing process, the component has a mean surface roughness of less than 15 nm and at least 10% of the implanted impurity atoms are electrically activated.

14 Claims, 2 Drawing Sheets

SEMICONDUCTOR COMPONENT WITH FOREIGN ATOMS INTRODUCED BY ION IMPLANTATION AND PROCESS FOR PRODUCING THE SAME

BACKGROUND OF THE INVENTION

The invention relates to a semiconductor component having impurity atoms introduced by ion implantation and a method for making the same.

The patent U.S. Pat No. 5,322,802 discloses electrically activating impurity atoms in semiconductor components, in particular, SiC components, by annealing the radiation damage in the semiconductor caused by ion implantation of the impurity atoms in the course of a thermal annealing process at a high temperature.

Furthermore, the literature discloses that high temperatures of significantly more than 1500° C. are necessary for activating the impurity atoms. On the one hand, the resistance of the component is intended to be small, i. e., a sufficient number of impurity atoms must be activated in the semiconductor; on the other hand, microscopic examinations show that the near-surface regions of the semiconductor, which are disturbed by the implantation of the impurity atoms, only recrystallize at a temperature considerably above this temperature and thus reattain a sufficiently crystalline order. This is explained, for example, in the publication by J. R. Flemish, K. Xie, H. Du, S. P. Withrow, Journal of the Electrochemical Society, vol. 142, No. 9 September 1995, p. L144–L146.

While improved electrical properties are observed after the annealing process at a high temperature, there is a marked deterioration of the surface morphology of the semiconductor. But in order to produce highly integrated components, the surfaces must be as smooth as possible. To accomplish this objective, expensive and time-consuming polishing processes are required after the annealing process.

SUMMARY OF THE INVENTION

It is the object of the invention to propose a component and a method for its fabrication, wherein the annealing process is permitted at temperatures above 1500° C., while the surface roughness of the component deteriorates by no more than 15 nm compared to the initial value and the electrical activation is improved.

This object is accomplished by a method for making a semiconductor component including the following steps subsequent to the ion implantation process carrying out an intermediate temperature treatment as a conditioning step at temperatures between 500° C. and 1500° C. for a limited time duration and subsequently carrying out the annealing process at temperatures above 1500° C.

This object is further achieved by a semiconductor component having impurity atoms introduced in near-surface regions by ion implantation, where the impurity atoms are electrically activated by a thermal annealing process and the component has a mean roughness value of less than 15 nm immediately after the annealing process.

Modifying and advantageous features can be taken from the dependent claims and from the description.

According to the invention, a component is subjected to an annealing process comprising a first step in which the near-surface regions of the semiconductor are conditioned, followed by a second step in which the implanted impurity atoms in the semiconductor are electrically activated.

Immediately following the annealing process and without further measures, the component according to the invention has a low mean surface roughness as well as a large number of electrically activated impurity atoms. It is particularly advantageous that, after the annealing process, the surface morphology is hardly changed compared to the initial state in spite of the effect of high temperatures. Measures such as expensive polishing processes can be omitted which, in an industrial production process, are time-consuming and cost-intensive.

It proves to be advantageous that such smooth surfaces are particularly suitable for being connected through a solderless and adhesive-free bonding process wherein the linkage comes about through the action of quantum electrodynamic effects between the atoms of the two surfaces to be bonded.

In the first step of the annealing process, the near-surface regions of the component are conditioned and stabilized vis-a-vis the further process steps. Therefore, high temperatures can be applied in a subsequent process step for the optimum electrical activation of impurity atoms, with the temperatures being comparable to temperatures that are generally used for annealing processes. A two-stage process with two successive temperature steps is advantageous while the temperature level is rising. But, advantageously, the transition from conditioning to activation can also take place by means of one or several temperature ramps within the process or also through temperature profiles combining temperature plateaus and temperature ramps.

It is particularly useful to initiate the conditioning already during the ion implantation if the latter is carried out at an elevated temperature.

The method according to the invention is suitable for all semiconductors. Preferably, it is used for those which tend to suffer a loss of material at elevated temperatures, e. g., through sublimation of a component of a semiconductor material.

BRIEF DESCRIPTION OF THE DRAWINGS

Below, the features which are essential to the invention are described in detail and they are explained in greater detail by way of drawings in which.

DETAILED DESCRIPTION OF THE INVENTION

The examples below substantially describe results obtained with SiC components; but the invention is not limited to this class of materials.

Figure 1:
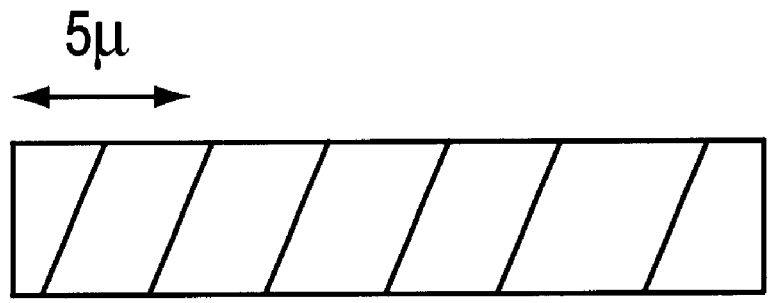
FIG. 1 is a schematic cross section of a component after the implantation of impurity atoms.

A semiconductor wafer, particularly made from SiC, having a highly polished surface serves as the starting material. The wafer is doped with impurity atoms, preferably aluminum, phosphorus, boron and/or nitrogen, by way of ion implantation. FIG. 1 shows a schematic cross section through such a semiconductor with implanted Al impurity atoms. Preferably, the dose amounts to up to $10^{15}$ cm$^{-2}$. The surface has a very small roughness (according to DIN 4768) with a mean roughness value $R_a$ between typically 1 and 10 nm. For the ion implantation, particularly for heavy impurity atoms, higher energies and/or higher doses, the near-surface region of the semiconductor is greatly disturbed up to the amorphization of the crystalline structure. The surface morphology is not substantially changed during the ion implantation; the surface roughness corresponds approximately to the state prior to the implantation.

The radiation damage in the semiconductor caused by the ion implantation is annealed in that the wafer is heated to a higher temperature at which it is held for a predetermined time, preferably for several minutes, in particular, preferably at least for 10 minutes. It is useful to heat the wafer in an inert atmosphere, particularly in inert gas or nitrogen. It is especially advantageous to select the atmosphere such that no undesirable doping and/or oxidation from the residual gas atmosphere occurs and/or no undesirable loss of a volatile component from the semiconductor.

Particularly for silicon-containing materials such as SiC, there exists the risk that above 1300° C. a silicon loss starts to occur by way of sublimation of Si in the near-surface region of the wafer. But for the electrical activation of implanted impurity atoms, considerably higher temperatures must be permitted to act on the semiconductor, preferably in the range above 1200° C., especially preferred above 1600° C., up to the possible melting temperature or sublimation temperature of the material. To suppress the Si loss, the wafer is heated in an encapsulated manner, usually, for example, in a crucible, preferably made from SiC, so as to increase the Si steam pressure and to thus minimize any possible silicon loss from the semiconductor.

Figure 2:
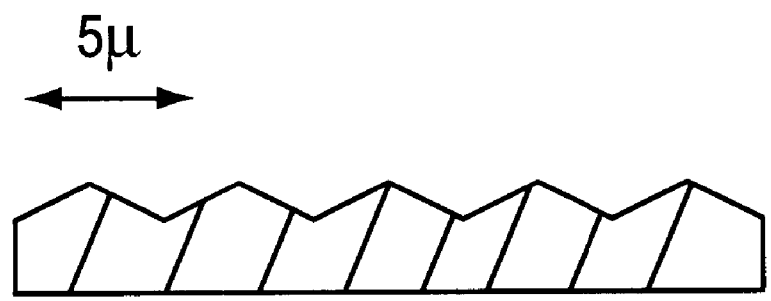
FIG. 2 is a schematic cross section of a component after the annealing process according to the state of the technology.

In spite of these measures, it is observed that the surface morphology deteriorates after the temperature is increased to, for example, 1600–1800° C. This is illustrated schematically in FIG. 2. The surface has a roughness of typically 100 nm up to several micrometers. In order to be able to continue to use such surfaces, e. g., for a semiconductor process with many successive component levels, expensive polishing methods are required which, in turn, can damage the near-surface regions and impair the surface properties.

Prior to the high-temperature step, which is absolutely necessary for the activation of the impurity atoms, the method according to the invention carries out a conditioning process step during which the surface of the semiconductor is ordered at least in regions.

It is useful to implement the first step at a temperature $T_1$, preferably above $T_1=700°$ C. –900° C., particularly preferable above $T_1=1200°$ C. At this temperature, the mobility of the atoms and ions it in the semiconductor is great enough, so that crystalline ordering processes can already start in the near-surface regions and/or the linkage relationships between the atoms can be stabilized in the disturbed structure. The temperature is a function, inter alia, of the semiconductor material and of the level of the radiation damage. For SiC, for example, it can be observed that the semiconductor material, which is clear and transparent prior to the implantation, is discolored after the implantation. If implantation takes place at around room temperature a, for example, dark brownish discoloration is observed. After the implantation at elevated temperatures, the semiconductor is visually improved, i. e., the discoloration is reduced. After an implantation temperature of preferably 900° C., there is significantly less discoloration than after an implantation at, e. g., 500° C., which can point to crystalline ordering processes which already started during the implantation. If the radiation damage in the semiconductor lattice is largely annealed through the action of a higher temperature, the semiconductor crystal becomes clear and transparent again.

If the semiconductor is left at or close to the temperature $T_1$ for a duration $t_1$, the radiation damage of the near-surface regions of the semiconductor can already be partially annealed afterward and/or the near-surface regions can at least have a less disarranged state. In the arranged state, the linkage enthalpy of the atoms in the semiconductor, for SiC, e. g., the linkage enthalpy between silicon and carbon, is greater than in the disarranged state in which, at one or several of the semiconductor constituents, a large number of unsaturated electron pair linkages is present. This greatly suppresses, for example, for silicon-containing semiconductor materials, the possible sublimation of the silicon in the temperature range between $T_1$ and the high temperature $T_2$. This first step in the annealing process, which stabilizes the near-surface regions of the semiconductor, is identified as conditioning step.

Figure 3:
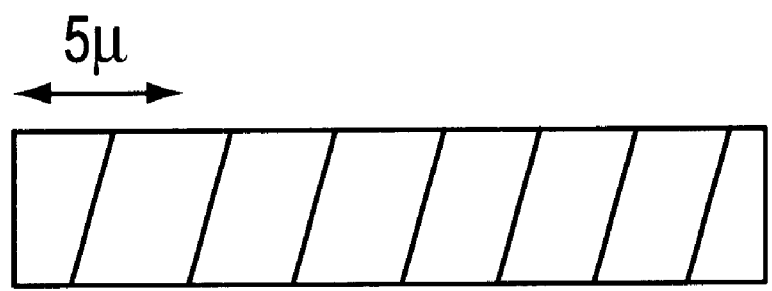
FIG. 3 is a schematic cross section of a component according to the invention.

The conditioning step in the process according to the invention leads to the result that, following the subsequent second step in the annealing process at a temperature $T_2$, preferably at a temperature higher than $T_1$, practically no deterioration of the surface morphology is observed compared to the morphology immediately following the ion implantation. The surface morphology after the second step of the method according to the invention is shown schematically in FIG. 3 by way of a cut through a component that was treated according to the invention. Compared to FIG. 2, the surface roughness is quite considerably less. The mean roughness value $R_a$ is smaller than 15 nm, in particular, smaller than 10 nm, even though the temperature $T_2$ for activating the impurity atoms is comparable to or equivalent to the usual activation temperatures of 1600–1800° C. After the activation step, the number of the electrically activated implanted impurity atoms in the semiconductor is high and at least as large as the normally achievable degree of activation.

Specifically, the achievable degree of activation is a function of the type of the implanted impurity atoms, the degree of the radiation damage during the ion implantation as well as of the implantation conditions. It is observed in SiC that with, e. g., 50%, atoms such as aluminum or particularly nitrogen have a greater degree of activation than, for example, boron for which 20% already represents a very high degree of activation. A degree of activation of the impurity atoms that is as high as possible is usually advantageous. The degree of activation is usually determined with the assistance of Hall measurements. For implanted nitrogen, a degree of activation of almost 100% is observed starting at an activation temperature of 1600° C. In the case of aluminum, approximately 25% of the implanted atoms are activated starting at a temperature of 1550° C., approximately 30% starting at a temperature of 1600° C., approximately 75% starting at a temperature of 1700° C., and approximately 100% starting at a temperature of 1800° C.

A preferred embodiment of the annealing process is that the temperature rises during the annealing process, in particular, in increments, and that it is kept constant at at least two temperatures $T_1$ and $T_2$ for a predetermined duration $t_1$ and $t_2$, respectively. In this process, the time durations and the temperatures must be matched to one another for different semiconductors and impurity atoms.

A further preferred embodiment is that between the first step at the temperature $T_1$, and the second step at the temperature $T_2$ an intermediate step is inserted at which the surface condition of the semiconductor is checked, preferably visually.

The temperature $T_1$ in the conditioning step according to the its invention is preferably lower than the temperature $T_2$ in the activation step of the annealing process, preferably higher or equal to 800° C., especially preferred lower or equal to 1500° C. It is advantageous for $T_2$ to be at least 1200° C.

In a further preferred embodiment, the temperature $T_1$ and the time duration $t_1$ of the first step are determined and varied until the mean roughness value of the semiconductor surface after the second step is below the desired value at a temperature $T_2$.

It is useful to heat the semiconductor as a whole in an inert atmosphere with or without encapsulation of the semiconductor. But it may be particularly advantageous if the heating takes place from the surface and not from the semiconductor body, e. g., through local action of electromagnetic radiation in the form of continuous irradiation or in the form of radiation pulses onto the near-surface regions of the semiconductor.

A further preferred embodiment of the annealing process is that the temperature during the annealing process rises continuously in the form of a temperature ramp R. A slow temperature ramp R means that the temperature is changed preferably at a rate between 5° C./min and 30° C./min. A rapid temperature ramp means that the temperature is changed at a rate between 30° C./min and more than 100° C./min. The upper limit substantially depends on the choice of the heater.

Figure 4:
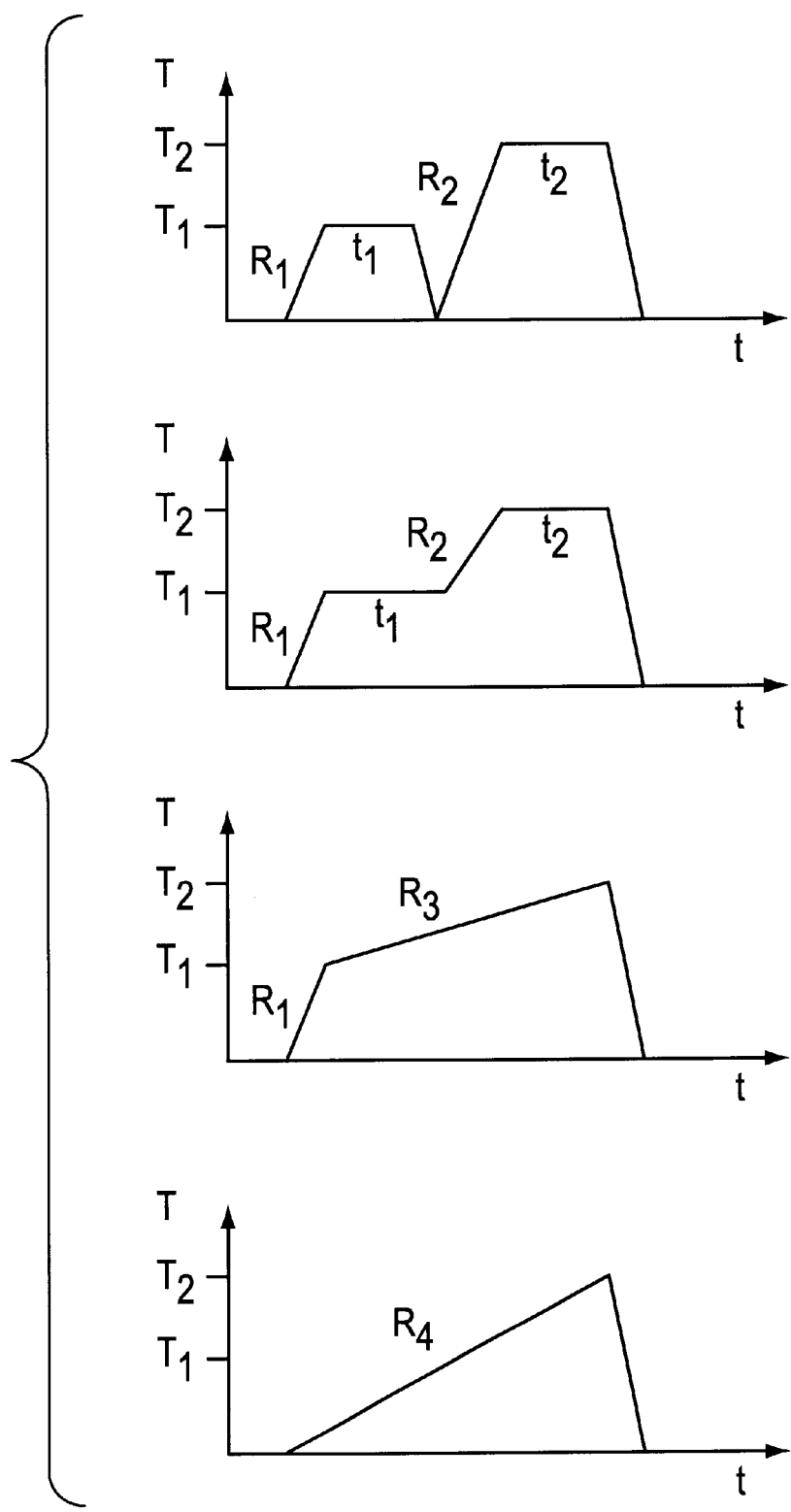
FIG. 4 illustrates temperature profiles for conditioning and activation of a component according to the invention.

FIG. 4 illustrates several advantageous temperature profiles as a function of the time for the method according to the invention. A preferred method is to leave the implanted semiconductor for a time duration $t_1$ at the temperature $T_1$ and for a time duration $t_2$ at the temperature $T_2$. During this process, the semiconductor is heated rapidly or slowly. The rise of the temperature ramp R can be constant, preferably slow. A particularly preferred embodiment is to select the rising slope of the ramp $R_1$ to be steeper in the proximity of the conditioning temperature $T_1$ than the ramp $R_2$ close to the activation temperature $T_2$. In-between the two temperatures $T_1$ and $T_2$, the temperature can also be lowered for a short time before it is elevated to $T_2$.

It is also possible to combine temperature plateaus and temperature ramps in the annealing process. Preferably, a temperature close to $T_1$ is set rapidly and then started up with a slow, continuous temperature ramp $T_1$. The transition to $T_2$ then again takes place rapidly, with $T_2$ being either kept constant on a preferred basis or being started with a ramp.

The method according to the invention is particularly advantageous and useful for shortening the process duration if the conditioning of the near-surface regions of the component is already implemented at least partially during the ion implantation. For this purpose, the ion implantation is carried out at an elevated temperature, preferably above 700° C., especially preferred above 900° C.

A semiconductor component from SiC according to the invention having impurity atoms preferably, e. g., aluminum, introduced by ion implantation, with a typical dose close to the amorphization limit at room temperature of $10^{15}$ cm$^{-2}$, which during the conditioning of the near-surface regions is annealed for approximately $t_1$=15 min at $T_1$ approx. 1200° C. and subsequently at $T_2$=1700° C. for a duration of $t_2$ approximately 15 min, has a mean roughness value $R_a$ of less than 15 nm immediately following the annealing process. Furthermore, immediately after the annealing process, at least 10% or more, preferably more than 50%, electrically activated implanted impurity atoms are present. It proves to be advisable to not exceed the amorphization threshold of the semiconductor during the implantation since, after the annealing, the radiation damage in the semiconductor cannot be entirely annealed. It is advantageous, particularly at temperatures above 100° C., to heat the semiconductor in an SiC crucible so as to increase the Si steam pressure in the atmosphere surrounding the semiconductor.

A component having a surface enhanced in this manner is particularly suitable to be bonded to other surfaces in a solderless and adhesive-free bonding process wherein the permanent linkage comes about through the action of quantum electrodynamic effects between the atoms of the two surfaces to be bonded. In this manner it is possible to bond different semiconductor materials or, e. g, powerful heat sinks or heat spreaders, e. g., made from diamond, onto the component according to the invention.

What is claimed is:

1. A method for making a SiC semiconductor component comprising the steps of:
   introducing impurity atoms into near-surface regions of the component by ion implantation;
   subsequent to the ion implantation process, carrying out an intermediate temperature treatment as a conditioning step at temperatures between 500° C. and 1500° C. for a limited time duration in which the near-surface region is ordered and stabilized; and
   subsequently carrying out a second temperature treatment for at least ten minutes as an activation step at temperatures above 1500° C. in which at least 10% of the impurity atoms are electrically activated.

2. A method according to claim 1 further comprising a step for checking the surface quality of the semiconductor component between the conditioning step and the second temperature treatment step.

3. A SiC semiconductor component having impurity atoms introduced in near-surface regions by ion implantation, the surface of the component annealed and ordered in a first, conditioning step of an annealing process at temperatures between 500° C. and 1500° C. and having a mean roughness value $R_a$ of less than 15 nm immediately after a second, activation step of the annealing process, and at least 10% of the impurity atoms being electrically activated in the activation step at temperatures above 1500° C. for at least 10 minutes.

4. A semiconductor component according to claim 3, wherein the component comprises at least 10% electrically activated implanted impurity atoms immediately after the annealing process.

5. A semiconductor component according to claim 3, wherein the component is composed with silicon.

6. A semiconductor component according to claim 3, wherein the component has at least one carbon-silicon compound.

7. The method according to claim 1, wherein the conditioning step and the activation step are carried out in an inert atmosphere.

8. The method according to claim 7, wherein the inert atmosphere is one of an inert gas and nitrogen.

9. The method according to claim 1, wherein the conditioning step and the activation step are performed in an encapsulated manner in a crucible of SiC so as to increase the Si steam pressure and to thus minimize any possible silicon loss from the semiconductor.

10. The method according to claim 1, wherein the activation step is carried out under temperatures between 1600° C. and 1800° C.

11. The method according to claim 1, wherein the activation step is carried out for a time span of approximately 15 minutes.

12. The method according to claim 1, wherein the activation step results in greater than 50% of the implanted atoms being electrically activated.

13. The semiconductor component according to claim 3, wherein greater than 50% of the impurity atoms are activated by said activation step.

14. The semiconductor component according to claim 3, wherein the mean roughness of the surface is between 1 nm and 10 nm.

* * * * *